(12) United States Patent
Huang

(10) Patent No.: US 7,504,652 B2
(45) Date of Patent: Mar. 17, 2009

(54) PHASE CHANGE RANDOM ACCESS MEMORY

(75) Inventor: Chien-Chao Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 147 days.

(21) Appl. No.: 11/180,430

(22) Filed: Jul. 13, 2005

(65) Prior Publication Data

US 2007/0012905 A1      Jan. 18, 2007

(51) Int. Cl.
   *H01L 47/00*      (2006.01)
(52) U.S. Cl. .............. 257/2; 257/E29.001; 257/295
(58) Field of Classification Search ......... 257/295–296, 257/303, 306, E29.001, E29.105, E29.17, 257/E49.001; 438/95, 102, 133
   See application file for complete search history.

(56) References Cited

U.S. PATENT DOCUMENTS

| | | | | |
|---|---|---|---|---|
| 5,378,659 | A * | 1/1995 | Roman et al. | 438/761 |
| 6,197,650 | B1 * | 3/2001 | Wu | 438/386 |
| 6,303,519 | B1 * | 10/2001 | Hsiao | 438/758 |
| 6,420,225 | B1 * | 7/2002 | Chang et al. | 438/237 |
| 6,511,862 | B2 | 1/2003 | Hudgens et al. | |
| 6,512,241 | B1 * | 1/2003 | Lai | 257/4 |
| 6,673,648 | B2 | 1/2004 | Lowrey | |
| 2003/0122156 | A1 | 7/2003 | Maimon | |
| 2003/0209746 | A1 * | 11/2003 | Horii | 257/295 |
| 2004/0042316 | A1 * | 3/2004 | Lee et al. | 365/223 |
| 2004/0126925 | A1 * | 7/2004 | Rodgers et al. | 438/95 |
| 2004/0248339 | A1 * | 12/2004 | Lung | 438/102 |
| 2005/0029503 | A1 | 2/2005 | Johnson | |

OTHER PUBLICATIONS

Y.H. Ha et al., "An Edge Con!act.Type.Cell for Phase Change RAMFeaturing Very Low Power Consumption,", 2003 symposium on VLSI iecnnotogy uigest of Tecnnical Papers, 12B-4, pp. 175-176.*
Ha, Y.H., et al., "An Edge Contact Type Cell for Phase Change RAM Featuring Very Low Power Consumption," 2003 Symposium on VLSI Technology Digest of Technical Papers, 12B-4, pp. 175-176.

* cited by examiner

*Primary Examiner*—Theresa T Doan
*Assistant Examiner*—Sarah K Salerno
(74) *Attorney, Agent, or Firm*—Slater & Matsil, L.L.P.

(57) ABSTRACT

A phase change memory device with a reduced phase change volume and lower drive current and a method for forming the same are provided. The method includes forming a bottom insulating layer comprising a bottom electrode contact, forming a bottom electrode film on the bottom electrode contact, forming an anti-reflective coating (ARC) film on the bottom electrode film, patterning and etching the ARC film and the bottom electrode film to form a bottom electrode comprising a side edge, and forming a phase change material portion on the ARC film and the bottom insulating layer, wherein the phase change material portion physically contacts the side edge of the bottom electrode. The method further includes forming a top electrode on the phase change material portion, and forming a top electrode contact on the top electrode.

20 Claims, 6 Drawing Sheets

PHASE CHANGE RANDOM ACCESS MEMORY

This application relates to the following co-pending and commonly assigned patent application: application Ser. No. 10/783,498, filed Feb. 20, 2004, entitled "Phase Change Memory Cell and Method of Its Manufacture," which application is incorporated herein by reference.

TECHNICAL FIELD

This invention generally relates to semiconductor devices and fabrication processes, and more particularly to a phase change random access memory device having a reduced phase change volume to improve device operation and a method of forming the same.

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have errors for reading states. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PRAM).

PRAM is a promising candidate for next generation memory due to several operating and engineering advantages, including high speed, low power, non-volatility, high density and low cost. PRAM has several advantages over other types of memory such as DRAM, SRAM, and Flash memory. For example, PRAM devices are non-volatile and may be written to with high speed, e.g., less than about 50 nanoseconds. Since transistors are not necessary to accomplish read and write operations, the memory cells may be formed at a high density. In addition, PRAM memory cells are compatible with CMOS logic and can generally be produced at low cost compared to other types of memory cells.

FIG. 1 illustrates a conventional bottom contact PRAM cell. A phase change material 2 is formed between a top electrode 4 and a bottom electrode contact 6. The phase change material 2 is heated up to a temperature higher than the melting temperature when a current passes through it. The temperature is then quickly dropped below the crystallization temperature. A portion of the phase change material, as shown in region 8, is changed to an amorphous state with high resistivity, thus the state of the PRAM cell is changed to a high resistance state. Region 8 can be reset back to crystalline state by heating up the phase change material 2 to a temperature higher than the crystallization temperature, but below the melting temperature, for a certain period.

One engineering challenge in improving PRAM devices is to reduce the programming current required to effectuate the reversible phase change. In general, assuming a given resistivity of the phase change material, a smaller electrode contact area produces a higher resistance and therefore a higher level of resistive heating (Joule heating) for a given applied writing (drive) current. Therefore, a smaller electrode contact area to the phase change material will correspondingly and desirably reduce drive current and thereby power consumption.

As a result, prior art methods of producing PRAM have attempted to reduce the electrode contact area, as the contact area scales with the phase change (information recording) element volume and therefore a required programming current. While certain prior art methods have been successful in reducing a contact area, process window limits on lithographic and etching processes have placed a lower limit on the achievable size of the contact area.

Other approaches have focused on changing the geometry of the contact in order to reduce the contact area. FIG. 2 illustrates a phase change memory device having an edge contact. A phase change material 12 has a contact region 20 with an edge of a bottom electrode 14. Since it is easy to form a very thin bottom electrode 14, the contact region 20 can have a small area, such as about 0.004 $\mu m^2$. Therefore, the current density is significantly improved. However, such an approach requires complex and costly manufacturing processes. For example, in order to form the side contact region 20, the bottom electrode 14 is deposited and patterned followed by the deposition of an inter-layer dielectric (ILD) 15. A trench 18 is formed in the ILD 15 downward into an insulating layer 22 in order to expose the side edge 20 of the bottom electrode 14. This prior art embodiment requires at least two masking (patterning) steps, one for the formation of the bottom electrode 14 and one for the formation of the trench 18.

Thus, there is a need in the memory device manufacturing art for an improved PRAM device and a method for forming the same to reduce processing steps and achieve lower production costs.

SUMMARY OF THE INVENTION

A phase change memory device with a reduced phase change volume and lower drive current and a method for forming the same are provided.

In accordance with one preferred embodiment of the present invention, the phase change memory device includes a bottom insulating layer comprising a bottom electrode contact, a bottom electrode on the bottom electrode contact wherein the bottom electrode comprises a side edge extending downward and stopping at a top surface of the bottom insulating layer, an anti-reflective coating (ARC) film on the bottom electrode, and a phase change material layer on the ARC film and the bottom insulating layer wherein the phase change material physically contacts the side edge of the bottom electrode. The phase change memory device further includes a top electrode on the phase change material layer.

In accordance with another preferred embodiment of the present invention, the method includes forming a bottom insulating layer comprising a bottom electrode contact, forming a bottom electrode film on the bottom electrode contact, forming an anti-reflective coating (ARC) film on the bottom electrode film, patterning and etching the ARC film and the bottom electrode film to form a bottom electrode comprising a side edge, and forming a phase change material portion on the ARC film and the bottom insulating layer wherein the phase change material physically contacts the side edge of the bottom electrode. The method further includes the steps of forming a top electrode on the phase change material portion and forming a top electrode contact on the top electrode.

The preferred embodiments of the present invention have several advantageous features. Firstly, a single patterning and etching step is performed to form the bottom electrode portion and the (ARC) electrical insulating portion, thus reducing the complexity and cost of manufacturing processes. Secondly, by avoiding forming a recess (trench) adjacent the side edge of the bottom electrode in the underlying bottom insulating layer, the size of the phase change material that undergoes phase change during the operations of the memory device is constrained, thus required programming current is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 3A through 8B, wherein like reference numbers are used to designate like elements throughout the various views and illustrative embodiments of the present invention. Throughout the description, each figure number may be followed by a letter A or B, indicating alternative steps or different views of forming the same structures.

Figure 1:
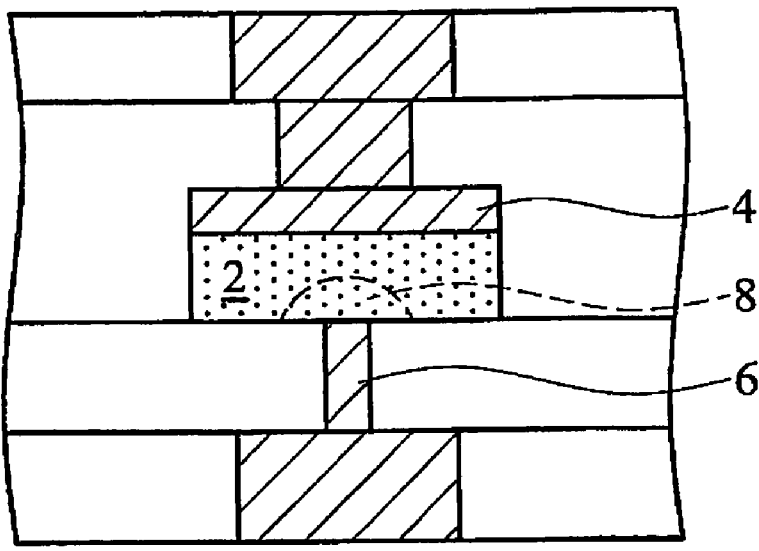
FIG. 1 illustrates a conventional bottom contact PRAM cell.
Figure 2:
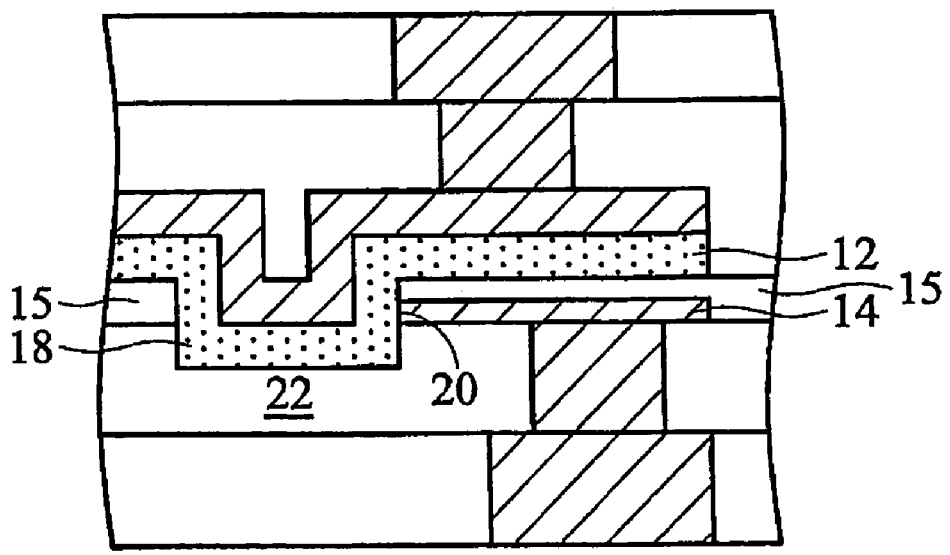
FIG. 2 illustrates a conventional edge contact PRAM cell.
Figure 3A:
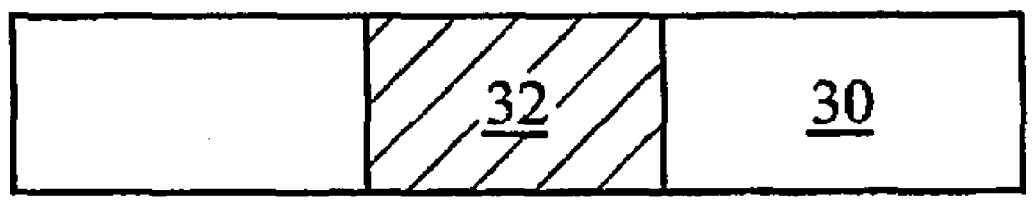
FIGS. 3A through 8B are cross-sectional views of intermediate stages in the manufacture of the preferred embodiments of the present invention.

Referring to FIG. 3A, a conductive line 32 and an insulating layer 30 are formed in a first metallization layer. In one preferred embodiment, the conductive line 32 may be formed by a metal etching process followed by forming the insulating dielectric layer 30, also often referred to as an inter-layer dielectric (ILD) layer. The conductive line 32 may include commonly used conductive materials such as metals or metal alloys including one or more of Al, AlCu, Cu, Ti, TiN, W, and the like. The conductive line 32 forms a portion of a current driving circuit (not shown) to provide current to the phase change memory element described subsequently.

Figure 3B:
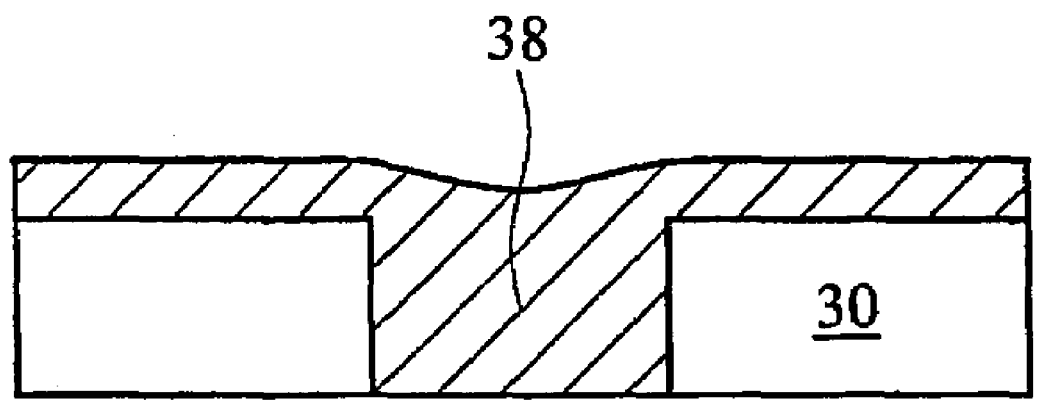

In other embodiments, the conductive line 32 is formed by single damascene processes, as illustrated in FIG. 3B, wherein the insulating layer 30 is formed followed by patterning a photo resist (not shown), etching a trench, and filling the trench with a conductive material 38. A chemical mechanical polish (CMP) is then performed to planarize surfaces of the conductive material 38 and the insulating layer 30. The remaining conductive material 38 forms the conductive line 32, as shown in FIG. 4A.

Figure 4A:
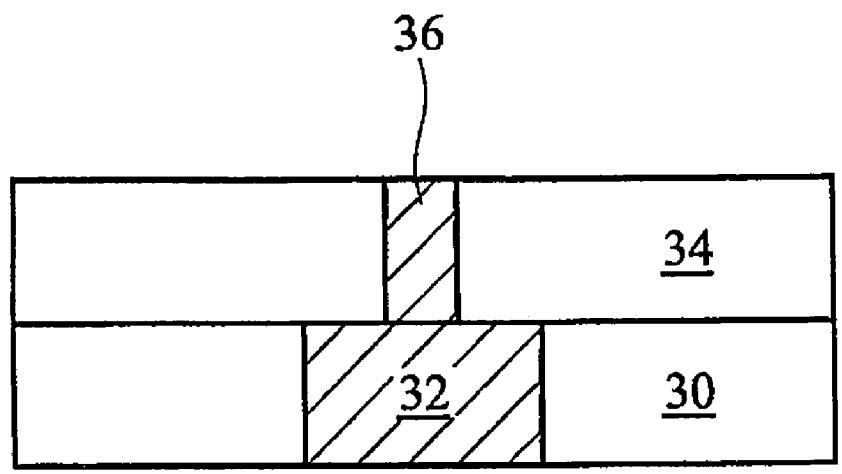

Referring to FIG. 4A, a bottom electrode contact 36 is formed on the conductive line 32. The bottom electrode contact 36 may be circular or rectangular in shape. In one preferred embodiment, the bottom electrode contact 36 is formed by depositing a metal layer, and then etching the metal layer to form a desired shape. Another insulating layer 34, often referred to as inter-metal dielectric (IMD) 34, is formed in the same layer as the bottom electrode contact 36.

Figure 4B:
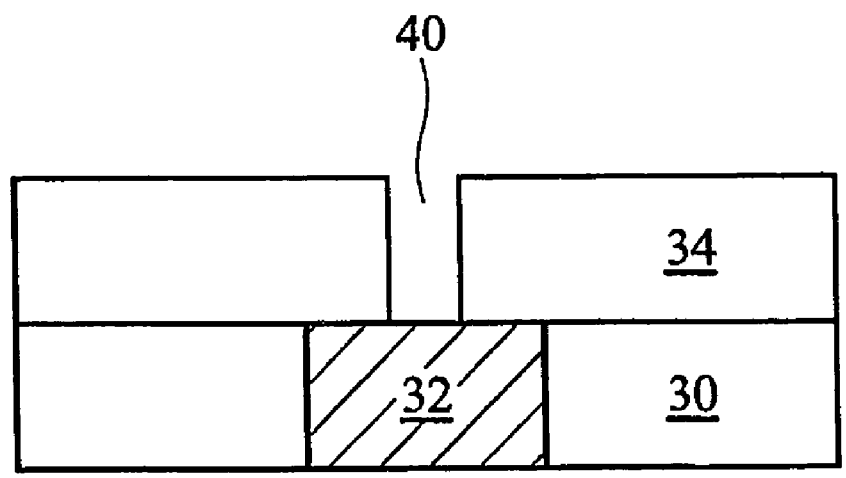

In other preferred embodiments, as shown in FIG. 4B, the bottom electrode contact 36 is formed by damascene processes, including first forming the insulating layer 34 followed by patterning a photo resist (not shown), and etching an opening 40 in the insulating layer 34. The opening 40 is then filled with a conductive material and a CMP is performed to remove excessive conductive material, thus forming the bottom electrode contact 36 of FIG. 5A. It will be appreciated that the conductive line 32 and the bottom electrode contact 36 may be formed simultaneously with the same conductive material in dual damascene processes, or may be formed of the same or different conductive materials in separate single damascene processes. In addition, a combination of metal etching and damascene processes may be employed to form the conductive line 32 and the bottom electrode contact 36.

Preferably, the bottom electrode contact 36 comprises conductive materials such as Ti, Co, TiN, TiW, W, TiAl, TiAlN, and combinations thereof, and is formed by known methods such as chemical vapor deposition (CVD), sputter deposition, and the like. It will be appreciated that the insulating layers 30 and 34 may be formed of one or more of a variety of dielectric insulating materials such as silicon oxide, tetra-ethyl-orthosilicate (TEOS) oxide, plasma enhanced silicon oxide (PEOX), fluorinated silicate glass (e.g., FSG), undoped silicate glass (USG), low-K (K<2.9) silicon oxide dielectrics such as carbon doped oxide, or organo silicate glass (OSG), as well as organic or inorganic spin on dielectrics (SOD), and the like.

Figure 5A:
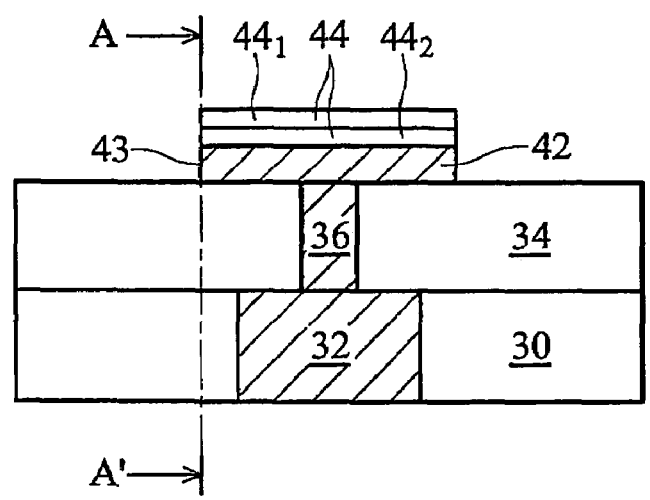

FIG. 5A illustrates the formation of a bottom electrode 42 and an overlying insulating element 44. A bottom electrode layer is blanket deposited, followed by forming an anti-reflective coating (ARC) film. The preferred methods for forming the bottom electrode layer includes CVD, PECVD, and sputter deposition, but other common methods can also be used. A single lithographic patterning step is then performed followed by an etching process (e.g., anisotropic reactive ion etch (RIE)). The ARC film and the electrode layer are etched to form the insulating element 44 and the bottom electrode 42, respectively. Following etching, the insulating element 44 is preferably left in place to electrically isolate the bottom electrode 42 from subsequently deposited phase change material.

In the preferred embodiment, the insulating element 44 is formed of an ARC film comprising an inorganic material, such as SiON, SiN, SiC, SiOC, and SiCN. This embodiment uses the existing ARC film so that production cost can be lowered. In alternative embodiments, the insulating element 44 can be formed by depositing a dielectric layer on the bottom electrode layer, and etching the dielectric layer (preferably together with the bottom electrode layer). The dielectric layer preferably comprises materials such as oxide, fluorinated silica glass (FSG), undoped-silicate glass (USG), Black Diamond® from Applied Materials, and/or low-K materials. In yet other embodiments, a surface portion of the bottom electrode layer is oxidized to form the insulating element 44. The insulating element 44 can be a multi-layer stack. FIG. 5A illustrates a two-layer insulating element 44 comprising two sub layers $44_1$ and $44_2$, although the insulating element 44 may include more than two layers. The film stack preferably includes a metal glue layer at the bottom of the film stack for enhancing the adhesion with the bottom electrode 42. An electrically insulating layer, such as an ARC film, a dielectric layer, or a combination of a dielectric layer and an ARC film, is preferably formed overlying the metal glue layer, wherein the dielectric layer and the ARC film comprise the same materials as previous discussed. The metal glue layer preferably comprises materials such as Ta, TaN, Ti, TiN. The ARC film (or the dielectric layer) is preferably deposited by a chemical vapor deposition (CVD), plasma enhanced CVD (PECVD), or other known method.

It will be appreciated that the bottom electrode 42 may be formed by conductive materials including the same or different conductive materials as the bottom electrode contact 36, including one or more of Ti, TiN, TiW, W, TiAl, TiAlN, and the like. The insulating element 44 preferably has a thickness ranging from about 100 Å to about 1000 Å.

The insulating layer 34 acts advantageously as an etch stop layer during the etching of the insulating element 44 and bottom electrode 42. Substantially no recess is formed in the insulating layer 34 adjacent the side edge 43 of the bottom electrode 42. This is an advantageous feature. If a recess is formed, a portion of the insulating layer 34 under the bottom electrode 42 may be undercut and more bottom electrode 42 will be exposed besides the side edge 43, causing the bottom electrode 42 to have more contact area with subsequently filled phase change material. The increase of the contact area will in turn require greater programming current and degrade the device performance.

Moreover, patterning and etching of the ARC film together with the bottom electrode layer requires only one lithographic patterning step. This avoids the necessity of separately depositing and patterning the insulating element 44 and the bottom electrode 42, thus the manufacture complexity is reduced and production cost is lowered.

Figure 5B:
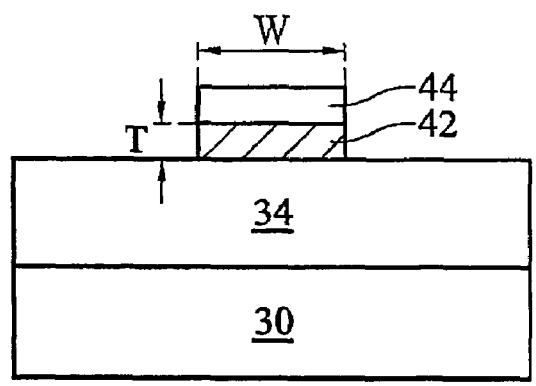
Figure 5C:
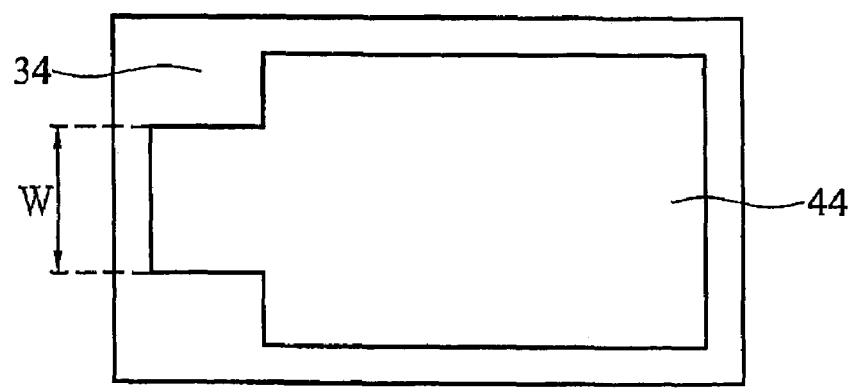

FIG. 5B illustrates a cross-sectional view along line A-A' in FIG. 5A. The contact area between the bottom electrode 42 and the subsequently formed phase change material is mainly determined by the width W and thickness T of the bottom electrode 42. Therefore, low thickness and width values are desired. Preferably, the width W is less than about 0.2 microns, and the thickness T is less than about 0.02 microns. To further reduce the width W, the bottom electrode 42 may have a smaller width W where it contacts phase change material than where it contacts bottom electrode contact 36. FIG. 5C illustrates an exemplary top view, wherein the insulating element 44 (and underlying bottom electrode 42) has a reduced width W.

Figure 6:
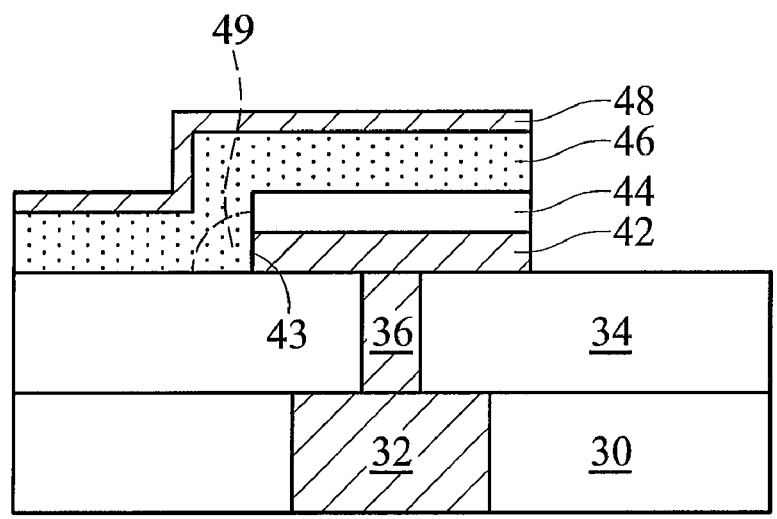

FIG. 6 illustrates the formation of a phase change element 46 and a top electrode 48. A phase change material layer is blanket deposited on the insulating element 44 and the insulating layer 34, forming a direct contact with the bottom electrode 42 at the side edge 43. The phase change material layer preferably comprises commonly used chalcogenide materials including one or more of Ge, Te, and Sb, e.g., preferably GeSbTe or stoichiometric materials. An upper (top) electrode layer is then formed, preferably by known deposition processes, on the phase change material layer. Preferably, the same conductive materials as that of the bottom electrode 42 are used, although different materials can also be used. The phase change material layer and the top electrode layer may be formed using commonly used methods such as CVD, PECVD, and the like. A lithographic patterning process followed by an etching process (e.g., anisotropic dry/RIE) is then carried out to form the phase change element 46 and top electrode 48.

For illustrative purposes, FIG. 6 illustrates a phase change portion 49 in the phase change element 46. The phase change portion 49 undergoes phase changes in the operation of the PRAM device. It is noted that the phase change portion 49 extends upward from the top surface of the insulating layer 34 along the side edge of the bottom electrode 42 and partially overlaps the ARC layer sidewalls.

Figure 7:
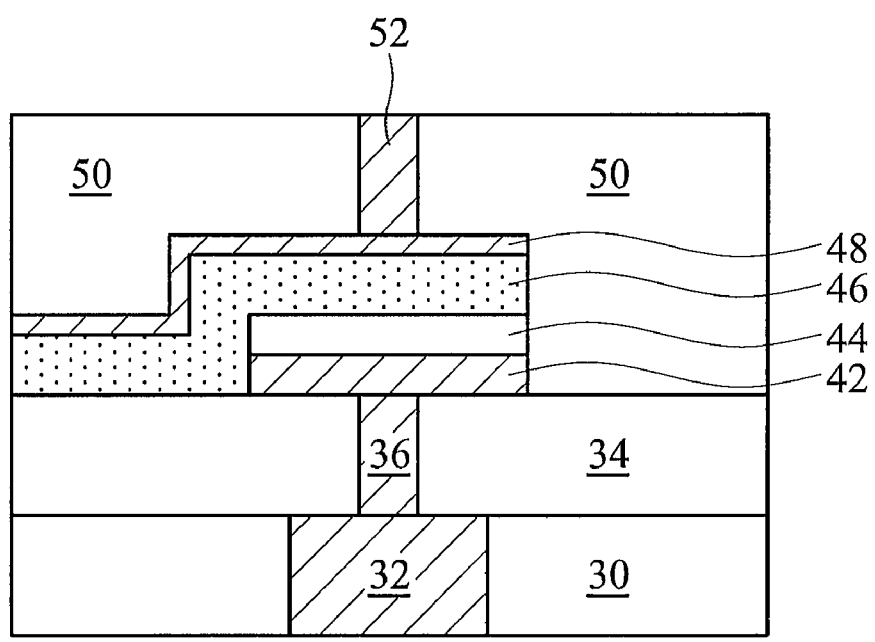

Referring to FIG. 7, a top electrode contact 52 and an insulating layer 50 are then formed, preferably in similar manners and using the same or different materials as outlined for forming the bottom electrode contact 36 and the insulating layer 34, respectively. The top electrode contact 52 may be formed by metal deposition and etching processes and/or by damascene processes. The insulating layer 50 is then formed in the same layer by etching, deposition and planarization processes. A portion of insulating layer 50 is preferably formed on the insulating layer 34. As shown in FIG. 5C, the insulating element 44 may have a first portion having width W, and a second portion having a width greater than width W. Top electrode contact 52 may be formed directly over the second portion of insulating element 44.

Figure 8A:
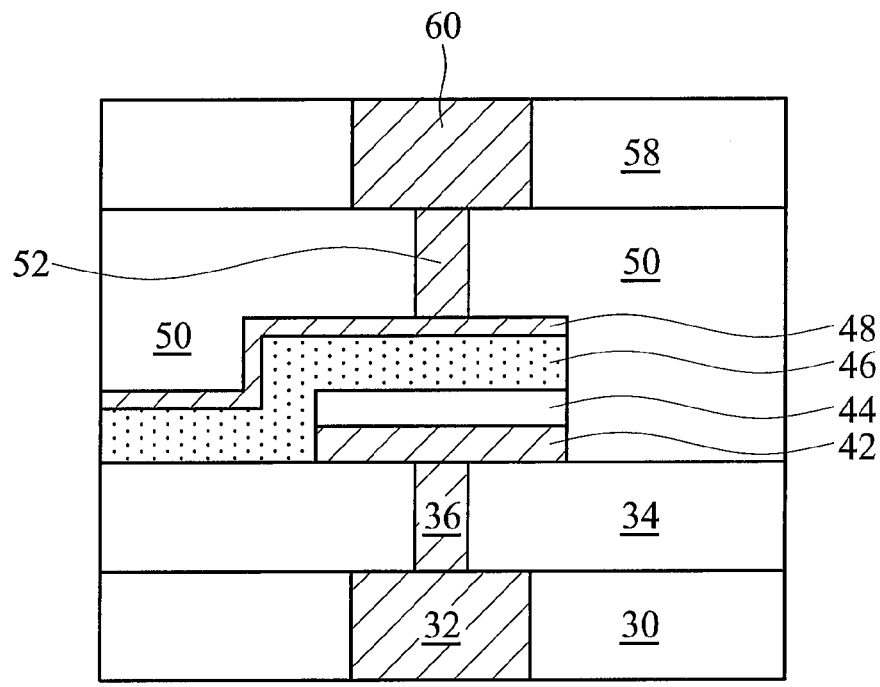

Referring to FIG. 8A, the preferred embodiments of the present invention are completed by forming an overlying metallization layer including a top conductive line 60 and an insulating layer 58, preferably using the same or different materials outlined for the conductive line 32 and the insulating layer 30.

Figure 8B:
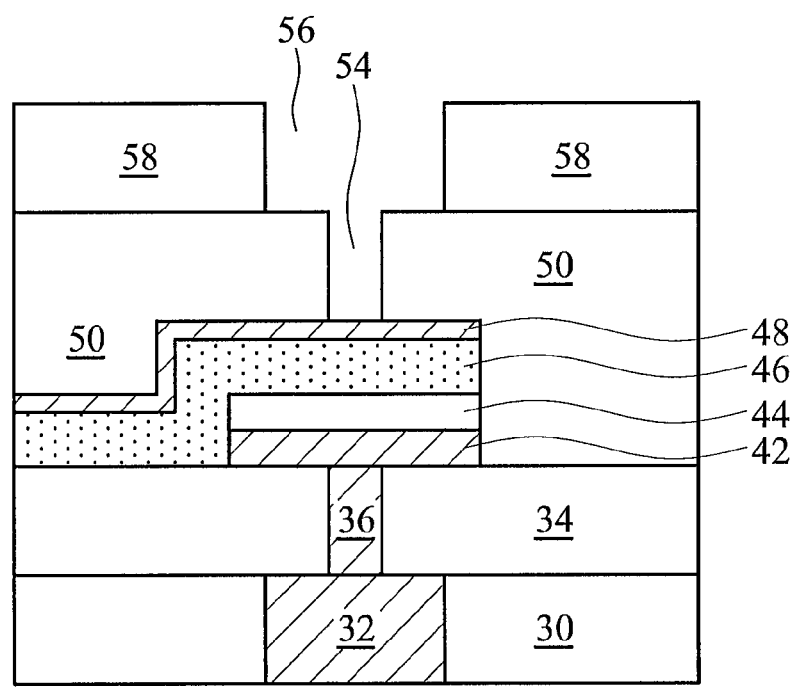

In other preferred embodiments, the top conductive line 60 and the top electrode contact 52 may be formed by dual damascene processes, as shown in FIG. 8B. After the formation of the top electrode 48, the insulating layer 50 is formed covering the entire structure formed in the previously discussed steps. Another insulating layer 58, preferably having different (etching) characteristics from the insulating layer 50, is formed on insulating layer 50. In other embodiments, an etch stop layer (not shown) might be formed between the insulating layer 50 and subsequently formed insulating layer 58, in which case layers 50 and 58 could have substantially similar (etching) characteristics. A via opening 54 and a trench opening 56 are then formed. Conductive materials, preferably comprising copper or copper alloys, are then filled in the openings. A CMP is then performed. The details of dual damascene processes are well known in the art, and thus are not repeated. The top electrode contact 52 and the top conductive line 60 may also be formed using separate single damascene processes, or a combination of metal etching and damascene processes.

The preferred embodiments of the present invention use (ARC) insulating element 44 to improve the processes of forming a side edge contact. As such, the necessity of extra deposition and patterning steps for forming an inter-layer dielectric layer and forming a recess in the ILD 34 is advantageously eliminated, thus the manufacturing complexity is reduced and cost is lowered. In addition, a single patterning and etching step to form the bottom electrode 42 and an electrical insulating element 44 improves the accuracy and alignment of the side edge of the contact with respect to the phase change portion, thus forming a smaller contact area and therefore increasing programming current density. The contact area is further reduced by avoiding the formation of a recess adjacent the side edge of the bottom electrode 42 in the underlying insulating layer 34. The process and structure according to the preferred embodiments of the present invention advantageously allow the formation of a smaller phase change (memory element) volume by constraining the phase change portion along the side edge of the bottom electrode.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A phase change memory device comprising:
a bottom insulating layer and a bottom electrode contact extending from a top surface to a bottom surface of the bottom insulating layer;
a bottom electrode on at least a portion of the bottom electrode contact and a portion of the bottom insulating layer, the bottom electrode having a side edge;
an insulating element on the bottom electrode, wherein the insulating element is substantially limited to a region directly over the bottom electrode;
a phase change material layer on the insulating element and extending onto the bottom insulating layer, wherein the phase change material layer physically contacts the side edge of the bottom electrode; and
a top electrode on the phase change material layer wherein the insulating element and the bottom electrode have substantially the same shape, and wherein all edges of the insulating element are substantially co-terminus with respective edges of the bottom electrode.

2. The phase change memory device of claim 1, wherein the side edge of the bottom electrode extends downward and stops on the top surface of the bottom insulating layer.

3. The phase change memory device of claim 1, wherein the insulating element is an anti-reflective coating (ARC) film comprising an inorganic dielectric material.

4. The phase change memory device of claim 3, wherein the ARC film comprises a material selected from the group consisting essentially of SiON, SiN, SiC, SiOC, SiCN, and combinations thereof.

5. The phase change memory device of claim 1, wherein the insulating element is a multi-layer stack.

6. The phase change memory device of claim 5, wherein the multi-layer stack comprises a metal glue layer and an overlying layer selected from the group consisting essentially of an ARC film, a dielectric layer, and combinations thereof.

7. The phase change memory device of claim 1, wherein the phase change material layer comprises a material having a phase change sensitivity to Joule heating.

8. The phase change memory device of claim 1, wherein the phase change material layer comprises a chalcogenide.

9. The phase change memory device of claim 8, wherein the chalcogenide comprises a material selected from the group consisting essentially of Ge, Te, Sb, and combinations thereof.

10. The phase change memory device of claim 1, wherein the bottom and top electrodes comprise a material selected from the group consisting essentially of Ti, TiN, TiW, W, TiAl, TiAlN, and combinations thereof.

11. The phase change memory device of claim 1, wherein the insulating element is limited only to the region directly over the bottom electrode.

12. The phase change memory device of claim 1 further comprising a top insulating layer comprising a top electrode contact, the top electrode contact electrically connecting the top electrode.

13. The phase change memory device of claim 1 wherein the bottom electrode has a width of less than about 0.2 microns.

14. The phase change memory device of claim 1, wherein a bottom surface of the phase change material layer is level with a bottom surface of the bottom electrode.

15. A phase change memory device comprising:
a bottom electrode contact having a first top surface in a bottom insulating layer having a second top surface, the first and second top surfaces being on substantially a same level;
a bottom electrode on the bottom electrode contact and the bottom insulating layer, the bottom electrode comprising a side edge extending downward and stopping on the second top surface;
an anti-reflective coating (ARC) film on and substantially overlapping the bottom electrode, wherein all terminal edges of the ARC film are substantially co-terminus with respective edges of the bottom electrode;
a phase change material layer on the ARC film, the bottom insulating layer, and along sidewalls of the ARC film and the bottom electrode, the phase change material layer being in physical contact with the side edge of the bottom electrode and at least a portion of a top surface of the ARC film;
a top insulating layer over the ARC film and extending beyond the terminal edges of the ARC film, wherein the top insulating layer has a bottom surface substantially level with a bottom surface of the bottom electrode;
a top electrode on the phase change material layer; and
a top electrode contact in the top insulating layer, the top electrode contact being over and electrically coupled to the top electrode.

16. The phase change memory device of claim 15 wherein the top insulating layer physically contacts the bottom insulating layer.

17. The phase change memory device of claim 1, wherein the bottom electrode comprises a first portion having a first width, a second portion having a second width greater than the first width, and wherein the first width is a width of the side edge.

18. The phase change memory device of claim 17 further comprising a top electrode contact over and electrically connected to the top electrode, wherein the top electrode contact is directly over the second portion of the bottom electrode.

19. The phase change memory device of claim 1, wherein all terminal edges of the insulating element are substantially vertically aligned with respective edges of the bottom electrode.

20. The phase change memory device of claim 1 further comprising a top electrode contact electrically connected to the top electrode, wherein the top electrode is between and adjoining the top electrode contact and the phase change material layer.

* * * * *